United States Patent [19]

Ortabasi

[11] Patent Number: 5,098,178
[45] Date of Patent: Mar. 24, 1992

[54] SUPERCONDUCTING MATRIX

[76] Inventor: Ugur Ortabasi, 5555 San Jose Dr., Pleasanton, Calif. 94566

[21] Appl. No.: 358,018

[22] Filed: May 30, 1989

[51] Int. Cl.⁵ ............................................. G02B 6/16
[52] U.S. Cl. ......................... 505/1; 204/192.24; 385/123; 385/141
[58] Field of Search .............. 204/192.24; 350/96.12, 350/96.29, 96.30, 96.34; 505/1

[56] References Cited

U.S. PATENT DOCUMENTS

| | | | |
|---|---|---|---|
| 3,748,728 | 7/1973 | Watson | 29/599 |
| 4,095,101 | 6/1978 | Lemelson | 250/227 |
| 4,152,386 | 5/1979 | Winter | 264/108 |
| 4,358,783 | 11/1982 | Hebard et al. | 204/192.24 X |
| 4,418,984 | 12/1983 | Wysocki et al. | 350/96.33 |
| 4,581,289 | 4/1986 | Dietrich et al. | 428/379 |
| 4,660,928 | 4/1987 | Jaeger et al. | 350/96.33 |
| 4,762,754 | 8/1988 | Nellis et al. | 505/1 |
| 4,842,704 | 6/1989 | Collins et al. | 204/192.24 |

FOREIGN PATENT DOCUMENTS

2616394  11/1977  Fed. Rep. of Germany.

Primary Examiner—John D. Lee
Attorney, Agent, or Firm—Watson, Cole, Grindle & Watson

[57] ABSTRACT

A superconductor has been disclosed which is formed of high temperature superconducting ceramic oxide particles distributed in a metal superconductor. In another embodiment, the superconducting particles are distributed in a dielectric matrix.

30 Claims, 4 Drawing Sheets

SUPERCONDUCTING MATRIX

Superconductors are devices that exhibit superconducting properties below a critical temperature $T_c$. For example, superconductors conduct electricity with virtually zero resistance and exhibit zero magnetic permeability below the critical temperature $T_c$. Above the critical temperature $T_c$, superconductors abruptly change and eventually lose their superconducting properties.

Superconducting materials are unstable under certain conditions. Their superconducting properties may be quenched in response to external magnetic fields, current densities they carry and thermal stimuli like infrared radiation. Similarly, instabilities may result sometimes from localized thermal heating effects within the superconducting body. In particular, in granular superconductors, a voltage drop appears between the grains and therefore electrical energy dissipation occurs across the tunneling barriers. Excessive localized current surges may also create electrically induced localized heating which leads to loss of superconducting properties.

So-called high temperature superconductors, that is, superconductors having a critical temperature significantly above 4° K., for example 77° K. (the boiling point of nitrogen) are extremely process sensitive. Superconducting materials such as $YBa_2, Cu_3 O_{9-2}$ are oxygen deficient perovskites. The superconductivity of such material is strongly correlated to oxygen deficiency. In other words the superconducting state of the material is a critical function of oxygen deficiency balance, which may be adversely affected if the material is reacted at high temperatures with a host of chemical elements. Thus high temperature processes like alloying, depositing such superconductors on a substrate, particularly dielectrics or forming such materials into various compositions or configurations may destroy the superconducting characteristics of the material.

Some low temperature superconductors like indium, lead or gallium when densely innoculated in matricies with dielectrics have been found to have higher critical currents ($I_c$) and higher critical fields ($H_d$) than a bulk sample of the same superconductors. Thus, there is, in theory, the ability of such granular superconductors in a dielectric matrix to carry higher currents than would normally be possible by conventional superconductors. The control of the dielectric properties and the superconducting properties of such matracies is therefore important.

SUMMARY OF THE INVENTION

The present invention relates to a high temperature superconductor (HTSC) comprising superconducting ceramic oxide particles (granules) distributed in a metallic superconductor. In another embodiment superconducting ceramic oxide particles, a metallic superconductor and a porous dielectric are distributed together.

In another embodiment, the present invention relates to a superconducting microcomposite matrix comprising a porous dielectric material and a ceramic high temperature ($T_c > 77°$ K.) superconductor mixed and suspended in the dielectric. A metallic, low temperature ($T_c < 30°$ K.) superconductor, having a relatively high thermal and electrical conductivity is brought into intimate contact with the porous dielectric and the high temperature superconductor for providing a mechanism to induce "Proximity Effect" and also a filamentary interwoven network throughout the matrix for equalizing or carrying away localized heat and localized excessive current surges to establish good interior heat sinking and current shunting.

In one embodiment of the invention, the ceramic superconductor material is a fine powder having a particle size around 0.2-1 microns, a relatively high critical temperature above 77° K., and an average particle distance between the grains comparable to the coherence length of HTSC. Preferably, the ceramic superconductor has a weight concentration of greater than 50% in the dielectric. The porous dielectric is a vitreous material formed at a temperature below that which would adversely effect the high temperature superconductor. The metallic low temperature superconductor is brought into intimate contact with the mixture of superconducting grains and porous dielectric. In such embodiment the conductor is in a molten state and it is forced into the pores of a pressure of about 150,000 to 200,000 psi at a temperature sufficiently low so as to avoid degradation of the constituent materials by any chemical reaction. Alternatively, the metallic low temperature superconductor may be deposited in the matrix by electrophoresis.

In another embodiment of the invention the matrix may be deposited on a transparent substrate such as glass or sapphire or an optical fiber. Alternatively, the substrate may be an photovoltaically active substance which produces charge carriers in response to incoming radiation. The superconducting matrix may be coated with one or more layers of conductive material.

In another embodiment of the invention a porous film of post annealed high critical temperature superconductor is deposited on a substrate by a plasma spray deposition electrophoretic process. The porous film is thereafter impregnated with the low temperature superconductor as described. All embodiments described above impregnated with low temperature superconductor/conductor material can provide "superconducting" electrical contacts between external normal conductors and HTSC.

BRIEF DESCRIPTION OF THE DRAWINGS

The accompanying drawings illustrate in schematic form a superconductor in accordance with the present invention. It should be understood that particle sizes, interparticle distances and thicknesses of the various coatings and substrates are not to scale but are somewhat exaggerated in order to illustrate the principles /and teachings of the present invention.

DESCRIPTION OF THE INVENTION

Figure 1:
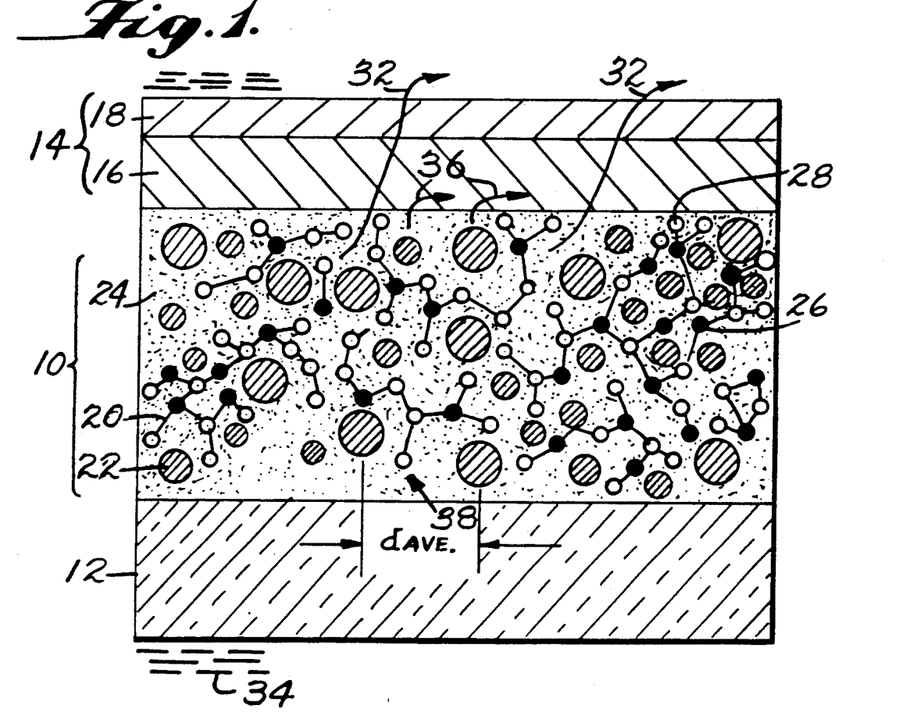
FIG. 1 is a schematic cross-section of a high temperature superconductor micro-composite according to one embodiment of the present invention.

FIG. 1 illustrates an exemplary embodiment of the superconductor of the present invention in the form of a high temperature superconducting matrix 10 which is formed between a glass substrate 12 and a overlying pair of metal coatings 14 including a relatively soft, silver coating 16 and a relatively hard external protective coating 18 such as chrome or nickel. The silver coating 16 exhibits high thermal and electrical conductivity but it does not exhibit superconductivity.

The superconducting matrix 10 is formed of a porous dielectric 20 with ceramic oxide superconducting inclusions or grains 22 and metallic superconducting inclusions or metal 24 distributed together. The dielectric 20 is formed from a polymerized vitreous gel. The metal 24 forms a continuous interconnected tortous filamentary network filling the voids or pores in the dielectric 20. The metallic inclusions 24 wet and couple the superconducting grains 22 into a continuous structure. The superconducting inclusions 22 preferably have a T relatively high critical temperature $T_c$ of about 77° K. or better, i.e., at or above the boiling point of liquid nitrogen. The critical temperature $T_c$ is the temperature at which a material exhibits superconductivity. The critical temperature is sometimes referred to in the art as the transition temperature. The metal 24 is a low critical temperature superconductor which exhibits relatively high electrical conductivity and high thermal conductivity although not necessarily superconducting characteristics at 77° K. The conductor metal 24 should have as high a Fermi velocity (e.g. 1.74 and $1.91 \times 10^{-6}$ m/sec for In and Ga, respectively) as possible. Typically, the metal 24 has a transition temperature less than about 10° K. Superconductivity will be induced at the interface and in part of the metal 24 at temperatures above its normal critical temperature by the close proximity of the metal 24 to the high critical temperature $T_c$ superconducting material 22, thus increasing critical current.

The dielectric 20 formed from the gel is a porous vitreous structure. The gel may be a material known as Sol-Gel which uses alkoxides $M(OR)_x$, where $M=Si$, B, Ti, Al and R is an alky group, such as $CH_3$, $C_2H_5$ as glass precursors, catalyzed by an acid or base in alcoholic solution at temperatures less than about 100° C. The metal alkoxide is partially hydrolized and polymerized to form a 3-dimensional glass-like network in which multivalent metal atoms 26 are linked together by bifunctional bridging oxygen atoms 28. The size of the pores of the glass like network may be controlled to allow the impregnation of a desired amount of indium into the Sol-Gel/HTSC matrix. The control of the pore size of the gel is described by R. B. Pettit and C. J. Brinker, "Use of Sol-Gel Thin Films and Solar Energy Applications", Solar Energy Materials 14 (1986) 269-287, North Holland, Amsterdam.

The purpose of the dielectric 20 is to provide a structural matrix with appropriate dielectric and surface properties to hold and bond the superconducting inclusions 22 in high densities exceeding 50 volume percent. Sol-gel matrices dense or porous have been shown to be able to accommodate a certain amount of fine ceramic particles to form a micro-composite structure without loosing their structural integrity. (W. and W. Associates, Inc. "Ceramics by Sol-Gel, A Techno-Economic Report, Nov. 1985). In addition, the anisotropic shrinkage of the Sol-Gel during polymerization is utilized to increase the concentration of the superconducting inclusions 22 so that the average particle distance $d_{(ave)}$ between the superconducting inclusions 22 approaches the coherence length as much as possible. An average particle distance comparable to the coherence length between the superconducting inclusions 22 is necessary in order to achieve significant enhancement through the proximity effect and high critical currents for the matrix 10. The superconducting inclusions 22 may be oxygen deficient perovskites such as $YBa_2, Cu_3 O_{9-x}$ where x is greater than 2.1. The superconducting inclusions 22 have an average particle size of about 10 micron or less.

The metal inclusions 24 provide a thermal equalizing network and current shunting network. An exemplary material for the metal inclusions 24 may be indium, gallium or lead. Indium has a relatively high thermal conductivity and a high electrical conductivity in the non-superconducting state. The metal inclusions 24 fill the pores 30 in the dielectric 20 and contact the grains 22 to thereby provide thermal paths within the superconducting matrix 10 for carrying localized heat 32 away from the matrix 10. In the embodiment shown, the optional overlying coatings 14 are in thermal contact with the metallic inclusions 24, to carry the heat 32 to the surrounding cooling bath 34.

Excess currents 36 which may occur and cause local loss of superconductivity in matrix 10, may also be conducted (shunted) via the metallic inclusions 24 to the soft silver coating 12. The excessive currents 36 are carried by the coating 12, whereby such currents in the matrix 10 are equalized and equilibrated. As mentioned above, localized heat 32, if significant, can quench the superconducting properties of the superconducting grains 22. In addition, excess currents 36 can also create magnetic field surges which are in excess of the critical field whereby the superconducting properties of the superconducting grains 22 are adversely affected. By providing the metal inclusions 24 both excess localized heat 32 and excess localized currents 36 are efficiently carried out of the matrix 10.

The presence of metal inclusions 24 in the barrier region 38 between grains 22 allows the heat 32 generated to be conducted away leading to greater stability. Also, the metal inclusions 22 are partly induced into the superconducting state at a higher temperature than its own critical temperature, by the proximity effect with the high temperature to superconducting particles 22. This latter phenomenon has a number of important consequences. The barriers 38 between the superconducting grains regions 22 are reduced by the proximity effect which in turn leads to a large increase in the current carrying capacity. Also, when a voltage does appear in the barrier region 38, the resistivity of the barrier junction is reduced, leading to increased stability. The higher the value of the Fermi velocity of the metal inclusions 24, the greater the increase in the current carrying capacity obtained. Therefore the metal inclusions 24 to be intruded into the matrix 10 should have as high a Fermi velocity as possible. This property is also preferred over a material with merely a low resistivity such as copper, which is not technically a low temperature superconducting metal, or other good thermal and electrical conductors such as gold or silver. Examples of suitable metal inclusions 24 include indium, lead and gallium, which not only have high Fermi velocities, but also conduct heat and electricity reasonably well and have a relatively low melting point. Gallium, for example, can be impregnated, which in liquid form into porous glass with a pore size of 10–100 Angstroms just above its melting temperature of 29.78° C. at 100K–150K psi. The low melting temperature of gallium assures that the oxygen depletion state of the superconducting particles 22 will not be adversely affected during the impregnation process. Alternatively the metal superconductor may be intruded into the matrix 10 by electrophoresis. The metal inclusions 24 interwoven with the superconducting grains 22, forms a multi-filamentary structure having a better heat transfer mechanism from the interior of the matrix 10. Thus, thermo-electromagnetic stability is increased.

Figures 2, 2A:
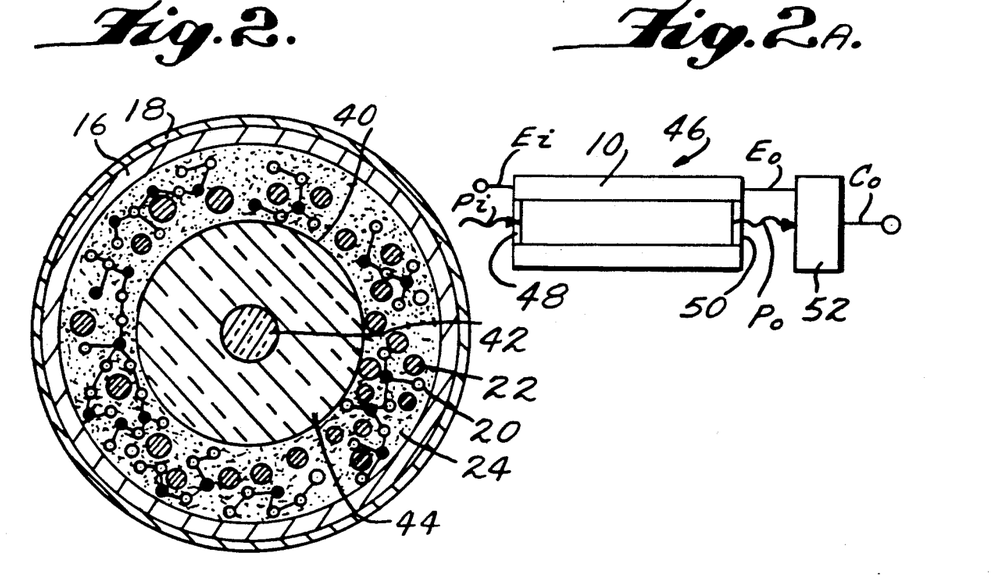
FIG. 2 is a schematic cross-section of an embodiment of the present invention in which the superconductor is deposited on the exterior of an optical fiber.
FIG. 2A is an illustration in schematic block form of a coincidence or anti-coincidence detector employing the embodiment of the invention illustrated in FIG. 2.

FIG. 2 illustrates another embodiment of the invention in which a glass fiber 40 acts as a substrate for the matrix 10 described above. In the arrangement illustrated in FIG. 2 the fiber 40 may be an optical fiber having a core 42 and a cladding 44. In the example illustrated in FIG. 2, the dielectric 20, including the superconducting inclusions 22 is deposited on an exterior surface of the cladding 44. The metal inclusions 24 are forced at high pressure into the porous structure of the dielectric 20. The overlying silver coating 16 and the hard protective nickel coating 18 are also provided.

The arrangement illustrated in FIG. 2 may be particularly adapted for applications in which the optical fiber 30 is used to conduct very fast and high frequency, high data rate light signals between microintegrated circuits or possibly between discrete circuits on chips located on the same wafer as in very large scale integrated (VSLI) circuits. The fiber optic core 32 may be used to transmit high frequency, high data rate light signals and the superconducting matrix 10 may be used to transmit high frequency electrical signals and power simultaneously. The arrangement shown in FIG. 2 may also be utilized to carry communication signals and electric power for relatively long distances at high speed and high frequency. Such an arrangement would provide also a means to send fast and high power electrical signals and retrieve light signals (or vice versa) to and from the same device or system in distance.

The configuration shown in FIG. 2A could also be used as a "coincidence" or "anti-coincidence" device 46 schematically illustrated in FIG. 2A, to establish the time and space correlation anti-correlation of dependent and/or independent events that generate light and electrical pulses, such as phenomena induced in high energy physics with particle accelerators. In FIG. 2A respective input electrical pulses $E_i$ and input light pulses $P_i$ are generated, for example, during some electromagnetic event. The input electrical pulse $E_i$ is coupled to the matrix 10 and the input light signal $P_i$ is coupled to the input and 48 of the fiber 30 as shown. The output electrical signal $E_o$ and the output light signal $P_o$ from the output end of the fiber are coupled to a coincidence gate 52 at the output end 50 of the device 46. The coincidence or anti-coincidence detector 52 includes means, not shown, which is independently responsive to the light signal $P_o$ and to the electrical signal $E_o$ to generate a coincidence output $C_o$ if $E_o$ and $P_o$ arrive within time resolution of the coincidence circuitry, or the coincidence circuitry generates a pulse (anti-coincidence), if either of $E_o$ or $P_o$ is delayed with respect to the other, because they are uncorrelated.

Figure 3:
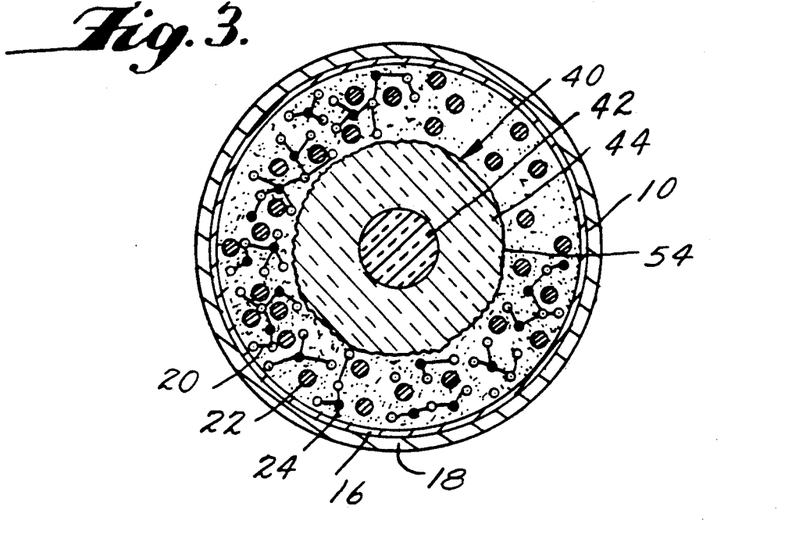
FIG. 3 is another embodiment of the present invention in which the superconductor is embedded into the surface of a porous substrate such as the etched cladding of an optical fiber or a porous film deposited firmly onto the cladding of an optical fiber.

FIG. 3 is a schematic cross-section of an optical fiber 40 having a superconducting matrix 10 deposited thereon. In the arrangement of FIG. 3, the cladding 44 has been chemically leached in order to render the surface 54 porous. Better adhesion of the matrix 10 onto the surface 54 of the optical fiber 30 is thereby achieved. The individual components of the dielectric 20, including the superconducting inclusions 22, and the metal inclusions 24 which have superconductivity induced at high temperature due to the proximity effect, the silver coating 16 and the hard nickel coating 18 are similar to the arrangements hereinfore described. It should be understood that any glass capable of being leached by known chemical leaching techniques may act as a substrate for the matrix 10 and such arrangements are intended to be included within the scope of the invention.

Figures 3A, 4:
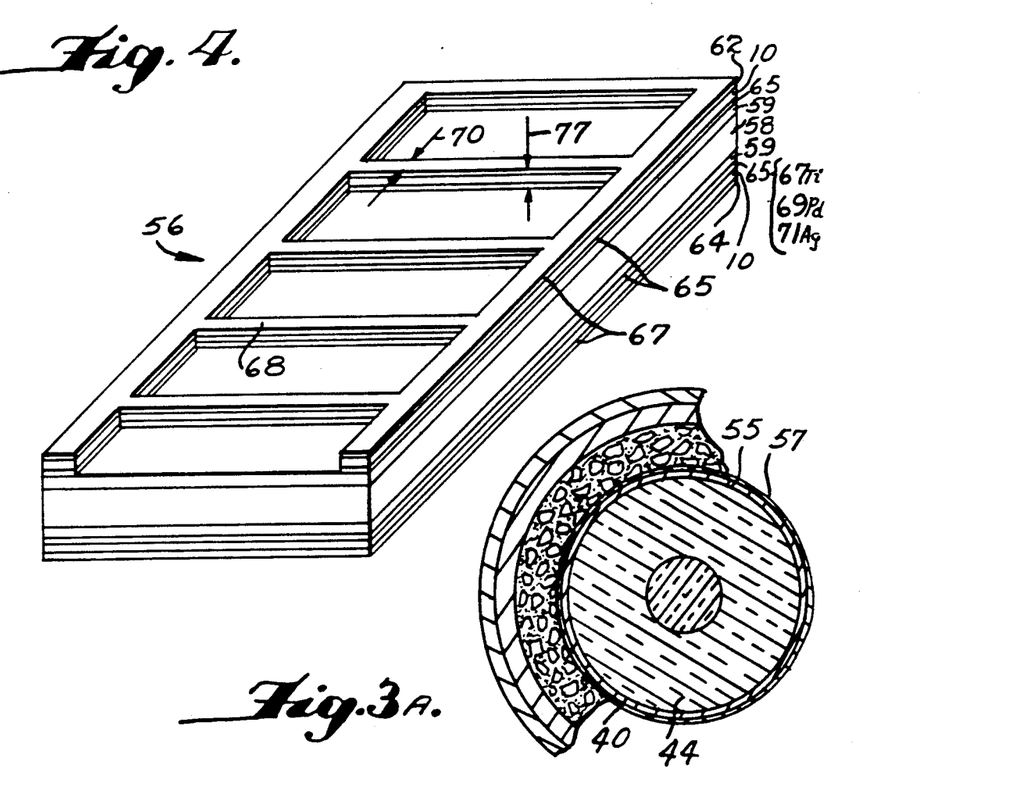
FIG. 3A is the cross-section of another embodiment of the present invention in which the cladding of the optical fiber is coated with a metallic thin barrier film on which a thick adhesion layer indium layer is deposited.
FIG. 4 is a schematic side sectional elevation of another embodiment of the present invention in which the superconductor is deposited on the surface of a photovoltaic cell to form a superconducting grid for removing charge carriers generated in the photovoltaic cell.

The embodiment shown in FIG. 3A a barrier thin film 55 (e.g. titanium $< 50\ \mu$) and a successive adhesion film 57 (e.g. indium $> \mu$) are deposited on the optical fiber cladding 44. These two layers are multi-purpose. The barrier film 55 protects the fiber cladding 44 against surface scratches that weaken the fiber strength. The adhesion film 57 provides good anchorage for the superconducting matrix. The adhesion film 57 is typically the same material as the superconducting metal 50 that impregnation, e.g. penetrating indium 24 fuses with the indium adhesion film 55 and thus bonds the matrix 10 to the cladding 44. The additional junction of the barrier metal film 55 and indium 57 forms a stress relieving ductile layer between the superconducting matrix 10 and the cladding 44 of the optical fiber 40.

In FIG. 4 a fragmented portion of a photovoltaic cell 56 is illustrated in perspective. A photovoltaic semiconductor wafer, e.g. silicon 58 having n or p type diffusion layers 59 forms a substrate for the matrix 10 located on opposite faces of the wafer 58. The dielectric 20 with the superconducting inclusions 22 and metallic inclusions 24 may form the respective top grid 62 and bottom electrical contact of the photovoltaic cell 56. The top grid 62 is in the form of a grating with bus bars 66 and fingers 68 which collect photo generated carriers under solar or other forms of radiation. The bottom contact 64 may be a solid plane or it may also be a grid similar to the top one for a two-sided (bifacial) photovoltaic device.

The superconducting contacts 62 and 64 increase the cell efficiency by eliminating part resistive losses due to the ohmic resistance of busbar and fingers. The contacts 62 and 64 also minimize contact grating area coverage or the so called shadowing losses as superconducting gratings can be made very thin. A three layer bonding film formed of Ti/Pd/Ag may be provided to attach the bus bars 62 and contact layers 64 to the semiconductor.

The titanium (Ti) layer 67 bonds to the substrate 59. The palladium (PL) layer 69 provides a barrier layer and the silver (Ag) 71 bonds the matrix 10 to the barrier layer.

It is well known, that the performance of photovoltaic devices is affected by the ohmic resistance of the busbars 66 and fingers 68 which carry the photoelectrically generated currents. The superconducting matrix 10 of the present invention provides an effective way to achieve a minimal ohmic series resistance for the photovoltaic cell 56 which thereby can greatly increase its efficiency. In addition the width 70 and the thickness 72 of the fingers 68 can be made much thinner than normal metal contacts as the current carrying capacity of the superconducting matrix 10 can be several orders higher. Thus, by using a superconducting "metallization" 62 as in FIG. 4 the metal coverage or shadowing losses of light sensitive 74 areas can also be minimized.

Reduced ohmic and shadowing effect losses together may increase the efficiency of a non-concentrating photovoltaic cell between about 15 to 20 relative percent. For example, assume a state of the art silicon photovoltaic cell that has an efficiency of around 15 percent. The efficiency of this photovoltaic cell with normal metal grating can be increased by about 2 or 3 absolute percent by eliminating the grating resistance losses and reducing the shadow losses of the cell. Thus the overall efficiency of a photovoltaic cell can be increased from about 15 percent to about 17-18 percent. This represents a relative increase of about 20%. Thus, for virtually the same cost, size and weight, power generating capacity of the photovoltaic cell may be increased significantly, assuming cooling costs are justified otherwise.

A particularly dramatic example of the improvement of the present invention is in space applications. Non-concentrating photovoltaic cells may be used in space where the temperature of the cell may be maintained below the critical temperature by means of radiative cooling, i.e., without additional cooling equipment. Thus, the increase in efficiency can effectively increase the payload of the space vehicle without actually changing its weight. For concentrating photovoltaic cells, i.e., cells designed to operate under increased solar flux intensities, the effect of the ohmic resistance becomes more important because the power loss caused by the overall series contact resistance increases with the square of the photo induced current. Application of superconducting contacts 62 and 64 may thus increase the efficiency of a 40 x concentrator by about 25 relative percent. The contacts 62 and 64 may not necessarily contain dielectric material and can be formed as described hereafter by plasma spraying and successive impregnation of the metal inclusion.

In the various embodiments herein described, the density of the superconducting inclusions 22 may be tailored by processing of the gel which is used to form the dielectric 20. For example, it may be desirable to saturate the gel material with superconducting inclusions 22 and centrifuge the material and thereby increase the density of superconducting particles 22 in order to reduce the mean particle distance $d_{(ave)}$ so as to permit high current carrying capacities. The curing time of the sol-gel can also be accelerated by microwave treatment of the superconducting matrix after application onto the optical fiber.

Figure 5A:
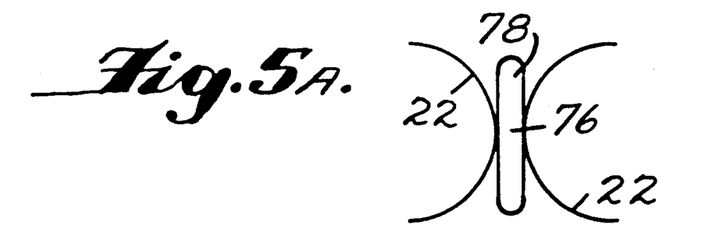
FIGS. 5A-5F illustrate schematically various forms of barrier mechanisms which provide superconducting coupling between superconducting inclusions.
Figure 5B:
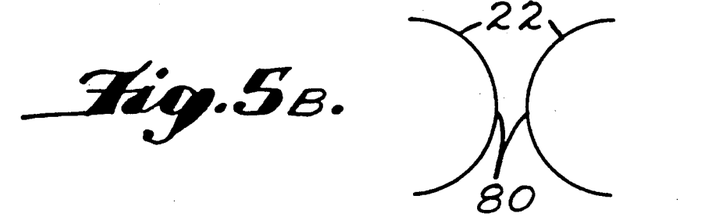
Figure 5C:
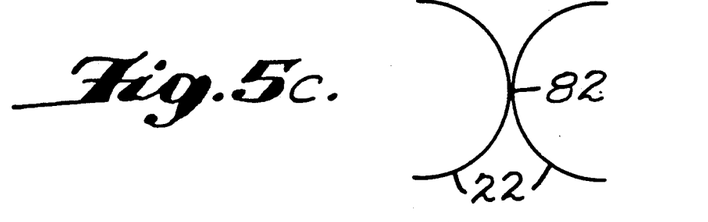
Figure 5D:
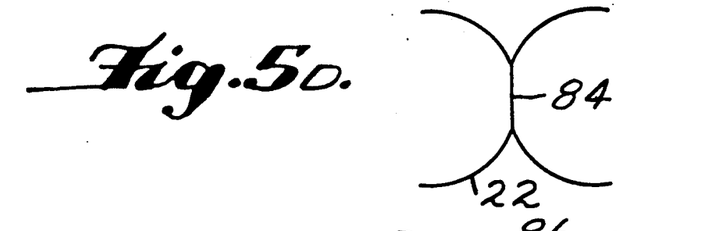
Figure 5E:
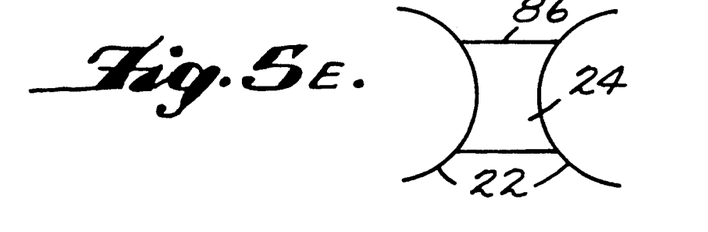
Figure 5F:
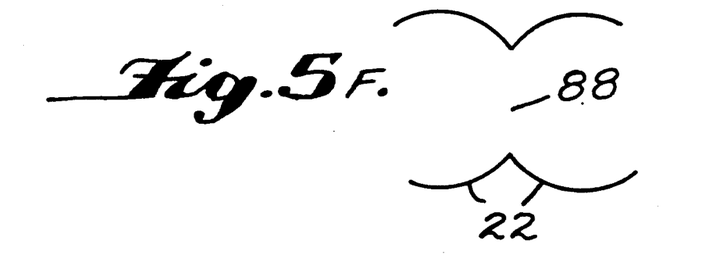

Various superconducting coupling mechanisms between inclusions 22 in the matrix 10 are illustrated by the examples of FIGS. 5A–5F. FIGS. 5A and 5B schematically represent tunnel junctions 76 across the insulating dielectric 78, and across a gap 80 respectively. FIGS. 5C–5F illustrate various forms of "weak-links" i.e. structures with non-tunnel type direct contact superconductivity. In FIG. 5C point contact 82 between inclusions 22 is illustrated. In FIG. 5D constricted contact 84 between inclusions 22 is illustrated. In FIG. 5E superconducting occurs through a metal proximity effect bridge 86 between the high temperature superconducting inclusions 22 via the metal inclusions 24. In FIG. 5F continuity 88 between inclusions 22 is illustrated. In all cases metal impregnation of the superconducting matrix increases the current carrying capacity. A theoretical model developed by Dr. Jim Watson and Dr. U. Ortabasi, the current carrying capacity of a granular system where brick formed HTSC granules are separated by 20 Å from each other is improved by a factor of $10^4$ if the 20 Å gaps are filled with indium (SBIR Navy Contract No. ND0164-88-C-0143, Final Report February 1989).

The following is a listing of exemplary materials which may be used as components to form the superconducting matrix 10 of the present invention. The listing is not inclusive of every possible candidate.

I. Substrate 12
  a. Glass
  b. Microsheet (e.g slide glass)
  c. Optical Fiber
  d. Fiber-glass (non-optical), ceramic fibers, carbon fibers
  e. Gallium Arsenide
  f. Silicon
  g. Copper
  h. Nickel
  i. Silver
  j. Gold
  k. Copper
  l. Aluminum
  m. Quartz
  n. Spinel II. Porous Dielectric 20
  a. Sol-Gel average pore size 10 A to 100 A or comparable to the coherence length of high temperature superconductor.

III. Superconducting inclusions 22
  a. Ceramic particles $YBa_2 Cu_3 O_{9-x}$ where x is greater than 2.1. Other high $T_c$ ceramics available in powder form. Particle size 2 micron to 10 micron. $d_{(ave)}$ in gel matrix less than 20 Angstroms; density more than 50 volume percent of the matrix.
  b. Porous films of high $T_c$ ceramic oxides up to several hundred microns as obtainable with plasma or thermal spray methods of deposition.

IV. Conductive Metal Inclusions 24 (low temperature superconductors) impregnated into pores at about 50K-150K psi at melting temperatures of metal
  a. Indium
  b. Lead
  c. Gallium V. Coatings
  a. Silver Thickness 10-50 microns, first coating (Inert with respect to matrix at the temperature of the formation or below)
  b. Nickel Thickness 1-200 microns, second coating
  c. ChromiumThickness 1-200 micron, second coating
  d. Plastic (for additional protection and electric insulation of the metallic surface)

VI. Films
  a. Barrier layer 55 Ti
  b. Adhesion film 57 In
  c. Bonding film 65
     Ti - 67
     Pd - 69
     Ag - 71
VII. Temperature and Pressures
  a. Temperatures should be sufficient to work material but low enough not to adversely affect oxygen depletion state of high temperature superconductors
  b. Pressures should be sufficiently high to impregnate pores with low temperature metal superconductors For applications in which so called high temperature ceramic oxide superconductors (i.e., $T_c$ higher than 77° K.) are utilized, it is possible that the superconducting properties of the material may be temporarily or permanently lost. The inclusion of indium or lead as the metallic inclusions 24 allows the system to be used as a low temperature superconductor if the high temperature superconductivity characteristics are lost. For example, a high $T_c$ superconducting circuit cooled by liquid nitrogen which loses its superconducting characteristics may be still able by the substitution of liquid nitrogen by liquid hellium in the system which will drive the temperature down to about 4.2° K. at which temperature the granular indium and lead may be suitably superconductive.

The present invention is less susceptible to failure because localized heating and localized excessive currents are dissipated by the metal inclusions 24 in the normal state. Further, the metallic inclusions 24 themselves act as superconductors at very low temperatures and partly at high temperatures due to the proximity effect with the grains 24.

Figure 6:
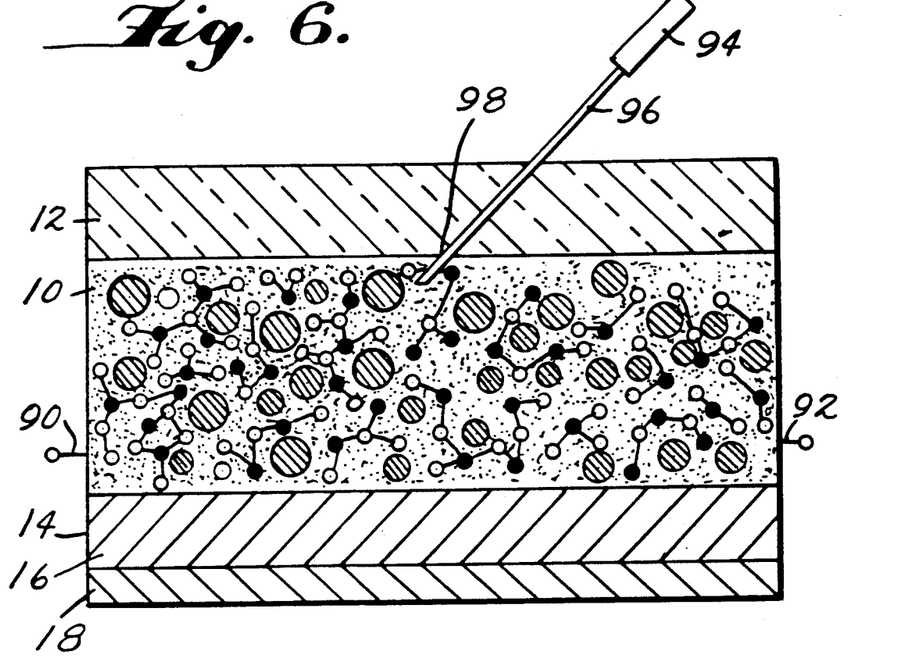
FIG. 6 is a schematic side sectional elevation of another embodiment of the present invention in which the superconductor, is light sensitive.

In the embodiment illustrated in FIG. 6 an optional glass substrate 12, which is transparent to visible light or other parts of the electromagnetic spectrum may be provided. If the superconducting properties of the matrix 10 are sensitive to light as described in "Superconductor/Light Interaction" by Christian Vanneste 1988 SPIE Tutorial, 1988 "Advances in Semiconductors & Superconductors: Physics & Device Applications" the matrix 10 illustrated in FIG. 1 may be used as a light controlled superconductor device. It should be readily understood that, in a different application, the soft silver coating 16 and overlying hard coating 18 may be provided in addition to or may be substituted for the glass substrate 12. It may also be possible to form other various layered arrangements.

In the embodiment illustrated the superconducting matrix 10 is deposited on the glass substrate 12. Respective input and output terminals 90 and 92 are illustrated in contact with the matrix 10. An energy source 94, for example, a laser may direct a beam of energy 96 at the matrix 10 through the transparent substrate 12 causing localized heating 98 in the matrix 10. If sufficient, the localized heating 98 can cause a momentary deterioration in the superconducting characteristics of the matrix 10. Accordingly, modulation of the energy source 94 can be used to modulate current or voltage signals appearing between the input and output terminal 90 and 92.

Figure 7:
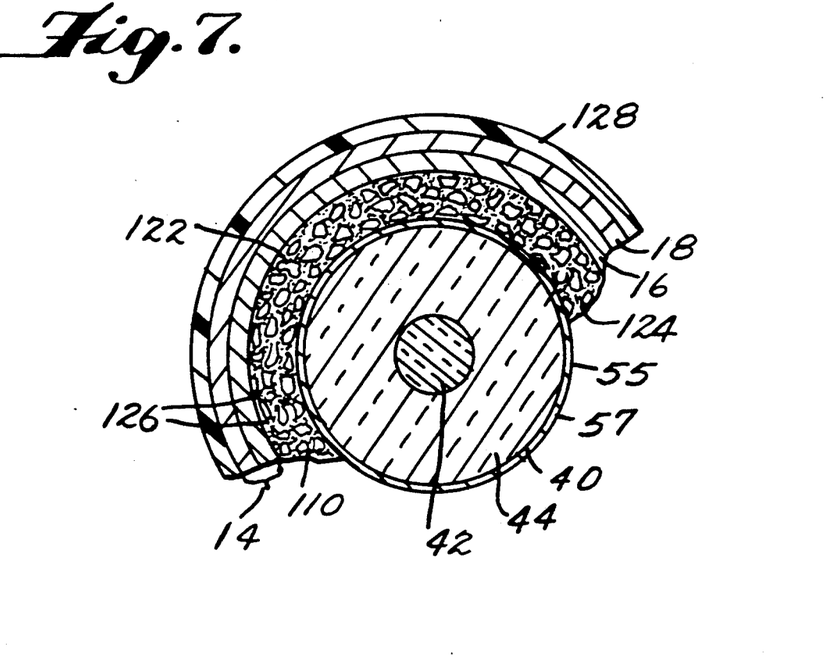
FIG. 7 is a schematic cross-sectional elevation of another embodiment of the present invention in which a thick porous granular high temperature superconducting film has been deposited on a substrate by a plasma spray deposition process, and the porous film is impregnated with an electrically and thermally conductive metal which is a low temperature semiconductor.

FIG. 7 illustrates another embodiment of the superconductor of the present invention. A modified porous superconducting matrix 110 is deposited as a porous thick film, e.g., several hundred microns, on a substrate such as an optical fiber 40 having a core 42 and a cladding 44. The pore size of the matrix 110 is comparable to the coherence length. The matrix 110 is formed of post annealed high temperature superconducting grains or inclusions 122 which have been plasma sprayed to a suitable thickness (e.g., 100-250 microns) on the fiber 40 or other suitable substrate such as quartz, copper, aluminum, glass and spinel, as shown. The fiber 40 may be pre-coated with the barrier and adhesion films 55,57 discussed above. Thereafter low temperature superconducting metal 124 is intruded in the pores 126 between the high temperature superconducting grains 122 as shown. The low temperature superconducting metal 124 may be in molten form and intruded between the superconducting grains 122 at high pressure. The melting point of the metallic inclusions 124 is relatively low and therefore does not change the oxygen depletion state of the high temperature superconductor 122. Alternatively the indium may also be applied by electrophonetic deposition. Overlying metal coating 14 of the type earlier described including a silver 16 and a hard coating 18, for example, may be deposited over the matrix 110. An insulating coating 128 of, for example, polyethylene or PVC may be deposited over the metallic coatings 14, as illustrated. It should be understood that the modified matrix 110 herein described may be applied to the various substrates in the embodiments hereinbefore described.

While the invention has been described in connection with specific embodiments thereof, it will be understood that it is capable of further modifications. The claims are intended to cover any variations, uses or adaptations of the invention following, in general, the principles of the invention, and including such departures from the present disclosure as come within known and customary practice within the art to which the invention pertains.

I claim:

1. A superconducting matrix comprising:
   a high temperature superconductor formed of relatively fine grain ceramic oxide particles having a critical temperature greater than about 77° K.;
   a porous dielectric material being intimately mixed therewith, and having a pore size resulting in an average particle distance sufficient for the matrix to exhibit superconductivity;
   a low temperature metal superconductor having relatively high thermal and electrical conductivity impregnated in the pores of the dielectric in intimate contact with the high temperature superconducting particles.

2. The superconducting matrix of claim 1, further including an electrically conductive coating thereon.

3. The superconducting matrix of claim 1, wherein the density of the superconducting particles is at least 50% by volume of the porous dielectric.

4. The superconducting matrix of claim 1, wherein the dielectric is a vitreous material.

5. The superconducting matrix of claim 1, further including a substrate for supporting the matrix comprising a glass surface.

6. The superconducting matrix of claim 5, wherein the glass surface is porous.

7. The superconducting matrix of claim 5, wherein the substrate is a glass fiber.

8. The superconducting matrix of claim 7, wherein the glass fiber is an optical fiber.

9. The superconducting matrix of claim 5 further comprising a double layer of a barrier metal film and a successive adhesion film formed on the substrate.

10. The superconducting matrix of claim 9 wherein the barrier metal film is titanium.

11. The superconducting matrix of claim 9 wherein the adhesion film is indium.

12. The superconducting matrix of claim 1, further including a photovoltaic substrate, the matrix being in electrical contact therewith.

13. The superconducting matrix of claim 1, in which the low temperature superconductor forms a thermal and electrical equalizing network for dissipating local heating within the matrix and for conducting throughout the matrix locally formed excess currents.

14. The superconducting matrix of claim 1, further including first and second electrically conductive coatings on the matrix, said first coating being a relatively soft high conductivity metal in contact with the matrix and the second coating being a relatively hard metal conductor overlying the first coating.

15. The superconducting matrix of claim 1, wherein at least the high temperature superconductor is sensitive to electromagnetic radiation, said sensitivity state and non-superconducting state in response to a sufficient amount of said electromagnetic radiation.

16. The superconducting matrix of claim 5, wherein the substrate is an optical fiber and the matrix carries electrical input signals and the fiber carries optical input signals and further including coincidence circuitry responsively coupled to the matrix and the fiber, wherein the coincidence circuitry includes means for independently detecting electrical and light outputs.

17. The superconducting matrix of claim 5, wherein the substrate is an optical fiber and the matrix carries electrical energy and the fiber carries optical energy.

18. The superconducting matrix of claim 17, wherein both the optical and electrical energy relate to both power and signal application.

19. The superconducting matrix of claim 17, wherein both the electrical and optical energy are at relatively high frequency.

20. The superconducting matrix of claim 19, wherein said high frequency energy occurs at relatively high data rates.

21. The superconducting matrix of claim 1, wherein the porous dielectric has a pore size sufficient to permit impregnation of the metal superconductor and mot more than the coherence length of the resulting matrix.

22. The superconducting matrix of claim 1 including superconducting contact portions for coupling the matrix to external devices.

23. A superconducting matrix comprising:
a porous high temperature superconductor of relatively fine grain ceramic oxide and having a critical temperature greater than 77° K. and having a pore size resulting in an average particle distance sufficient for the matrix to exhibit superconductivity; and
a low temperature metallic superconductor impregnated in the pores of the high temperature superconductor and having a relatively high thermal and electrical conductivity, said superconducting materials being impregnated in intimate mechanical, thermal and electrical relationship to form said matrix without melting the high temperature superconductor.

24. The superconducting matrix of claim 23, wherein the low temperature metallic superconductor includes metals selected from the group consisting of indium, gallium and lead.

25. The superconducting matrix of claim 23, further including an outer protective coating of a material selected from the group consisting of chromium and nickel.

26. The superconducting matrix of claim 23 wherein the high temperature superconductor comprises $YBa_2Cu_3O_{9-x}$ ceramic particles sized from about 0.2-10 $\mu$, wherein x is greater than 2.1.

27. The superconducting matrix of claim 23, wherein the porous high temperature superconducting material comprises Sol-Gel having a pore size comparable with the coherence length of the high temperature superconductor.

28. The superconducting matrix of claim 23, wherein the pore size is about 10-100 angstroms.

29. A superconducting matrix comprising:
a porous high temperature superconducting material of relatively fine grain ceramic oxide and having a critical temperature greater than 77° K. and having a pore size resulting in an average particle distance sufficient for the matrix to exhibit superconductivity; and
a low temperature metallic superconductor impregnated in the pores of the high temperature superconductor and having a relatively high thermal and electrical conductivity, said superconducting materials being impregnated in intimate mechanical, thermal and electrical relationship to form said matrix, wherein the high temperature superconducting material is formed by plasma deposition and the low temperature superconductor is forced into the pores in a liquid state at relatively high pressure.

30. A superconducting matrix comprising:
a porous high temperature superconducting material of relatively fine grain ceramic oxide and having a critical temperature greater than 77° K. and having a pore size resulting in an average particle distance sufficient for the matrix to exhibit superconductivity; and
a low temperature metallic superconductor impregnated in the pores of the high temperature superconductor and having a relatively high thermal and electrical conductivity, said superconducting materials being impregnated in intimate mechanical, thermal and electrical relationship to form said matrix, wherein the high temperature superconducting material is formed by plasma spray deposition and the low temperature superconductor is impregnated therein by electrophoresis.

* * * * *